(12) United States Patent
Pergande et al.

(10) Patent No.: US 9,412,638 B2
(45) Date of Patent: Aug. 9, 2016

(54) END EFFECTOR PADS

(71) Applicant: Varian Semiconductor Equipment Associates, Inc., Gloucester, MA (US)

(72) Inventors: Paul E. Pergande, Austin, TX (US); Charles T. Carlson, Cedar Park, TX (US); Krag R. Senior, Austin, TX (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 22 days.

(21) Appl. No.: 14/291,982

(22) Filed: May 30, 2014

(65) Prior Publication Data
US 2015/0279720 A1 Oct. 1, 2015

Related U.S. Application Data

(60) Provisional application No. 61/970,970, filed on Mar. 27, 2014.

(51) Int. Cl.
*B66F 19/00* (2006.01)
*H01L 21/687* (2006.01)
*H01L 21/677* (2006.01)

(52) U.S. Cl.
CPC .... *H01L 21/68707* (2013.01); *H01L 21/67742* (2013.01)

(58) Field of Classification Search
CPC .............. H01L 21/68785; H01L 21/68771; H01L 21/673; H01L 21/68707; H01L 21/683; B25J 11/0095; B25J 15/0475
USPC .................................. 294/213, 902; 414/941
See application file for complete search history.

(56) References Cited

U.S. PATENT DOCUMENTS

| | | | | |
|---|---|---|---|---|
| 5,700,046 A | * | 12/1997 | Van Doren | H01L 21/68707 394/119.1 |
| 2002/0071756 A1 | | 6/2002 | Gonzalez | |
| 2004/0113444 A1 | * | 6/2004 | Blonigan | H01L 21/68707 294/213 |
| 2005/0285419 A1 | | 12/2005 | Matsumoto et al. | |
| 2006/0181095 A1 | | 8/2006 | Bonora et al. | |
| 2010/0034625 A1 | | 2/2010 | Kim | |
| 2013/0209198 A1 | | 8/2013 | Forderhase et al. | |
| 2013/0213169 A1 | * | 8/2013 | Tan | F16F 7/10 74/490.01 |
| 2014/0265392 A1 | * | 9/2014 | Pergande | B25J 15/0014 294/81.5 |
| 2014/0265394 A1 | * | 9/2014 | Pergande | H01L 21/67742 294/81.5 |

OTHER PUBLICATIONS

International Search Report and Written Opinion mailed May 29, 2015 in corresponding international patent application No. PCT/US2015/018873.
Pergande, Paul E., Wafer Handling Apparatus, U.S. Appl. No. 13/800,766, filed Mar. 13, 2013.

* cited by examiner

Primary Examiner — Gabriela Puig

(57) ABSTRACT

An end effector pad including a fence member, a first recessed support member extending from a first side of the fence member, a second recessed support member extending from a second side of the fence member opposite the first side, a first glass plate having a relatively low coefficient of friction disposed on top of the first recessed support member for supporting a substrate thereon, and a second glass plate having a relatively low coefficient of friction disposed on top of the second recessed support member for supporting a substrate thereon.

5 Claims, 5 Drawing Sheets

END EFFECTOR PADS

This application claims the benefit of U.S. Provisional Patent Application No. 61/970,970, filed Mar. 27, 2014, which is incorporated by reference herein in its entirety.

FIELD OF THE DISCLOSURE

Embodiments of the present disclosure generally relate to the field of substrate processing, and more particularly to end effectors for use in a substrate handling systems.

BACKGROUND OF THE DISCLOSURE

Silicon wafers are used in semiconductor or solar cell fabrication. The wafers are subjected to a manufacturing process that may involve a plurality of machines and a plurality of stations. Thus, the wafers need to be transported from one machine/station to another machine/station one or more times.

The transport of the wafers typically employs apparatuses called end effectors. A typical end effector may be hand-like in appearance where a base unit may attach to a plurality of finger-like extensions ("fingers"). On each of the fingers, a plurality of wafers may be seated atop wafer pads at spaced apart intervals. The end result may be a matrix of wafers supported by the plurality of end effector fingers. The end effector may typically be moved linearly (e.g., forward and backward) as well as rotationally all in the same plane (e.g., x-y axis). The end effector may also be moved in a third direction along a z-axis to provide a full range of motion.

Some end effector designs have difficulty maintaining proper alignment of wafers supported thereon during transport, which may result in wafers being positioned incorrectly during subsequent processes. What is needed is a new end effector design that can maintain proper alignment of wafers supported thereon.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments of the present disclosure are generally directed to an end effector pad having substrate support surfaces with a relatively low coefficient of friction for facilitating alignment of substrates using relatively small acceleration forces. This may eliminate or at least mitigate vibrations in the fingers of an end effector that can result from large acceleration forces, such vibrations being known to cause movement and misalignment of substrates.

An embodiment of an end effector pad in accordance with the present disclosure may include a fence member, a recessed support member extending from a first side of the fence member, and a plate disposed on top of the recessed support member for supporting a substrate thereon. The end effector pad may further include a second recessed support member extending from a second side of the fence member opposite the first side, and a second plate disposed on top of the second recessed support member for supporting a substrate thereon.

Another embodiment of an end effector pad in accordance with the present disclosure may include an elongated first support member having a pair of upper support surfaces separated by a recess, a fence member partially seated within the recess of the first support member, wherein a bottom surface of the fence member is disposed below the upper support surfaces of the first support member. The end effector pad may further include an elongated second support member having a pair of upper support surfaces separated by a recess, the first and second support members being disposed in a parallel, spaced-apart relationship, the fence member extending perpendicularly across the first and second support members and being partially seated within the recess of the second support member, wherein the bottom surface of the fence member is disposed below the upper support surfaces of the second support member.

An embodiment of an end effector pad assembly in accordance with the present disclosure may include a first fence member having first and second recessed support members extending from opposite sides thereof and a second fence member having third and fourth recessed support members extending from opposite sides thereof, wherein the third and fourth recessed support members are parallel with and spaced apart from the first and second recessed support members, wherein the first and second fence members and the first, second, third, and fourth recessed support members are integral components of a single, contiguous body.

BRIEF DESCRIPTION OF THE DRAWINGS

By way of example, various embodiments of the disclosed device will now be described, with reference to the accompanying drawings, in which.

DETAILED DESCRIPTION

The end effector described herein can be used in connection with substrate handling equipment such as ion implantation systems, deposition systems, etching systems, lithography systems, vacuum systems, or other systems that process substrates. The substrates may be solar cells, semiconductor wafers, light-emitting diodes, or other wafers known to those skilled in the art. Thus, the present disclosure is not limited to the specific embodiments described below.

Figure 1:
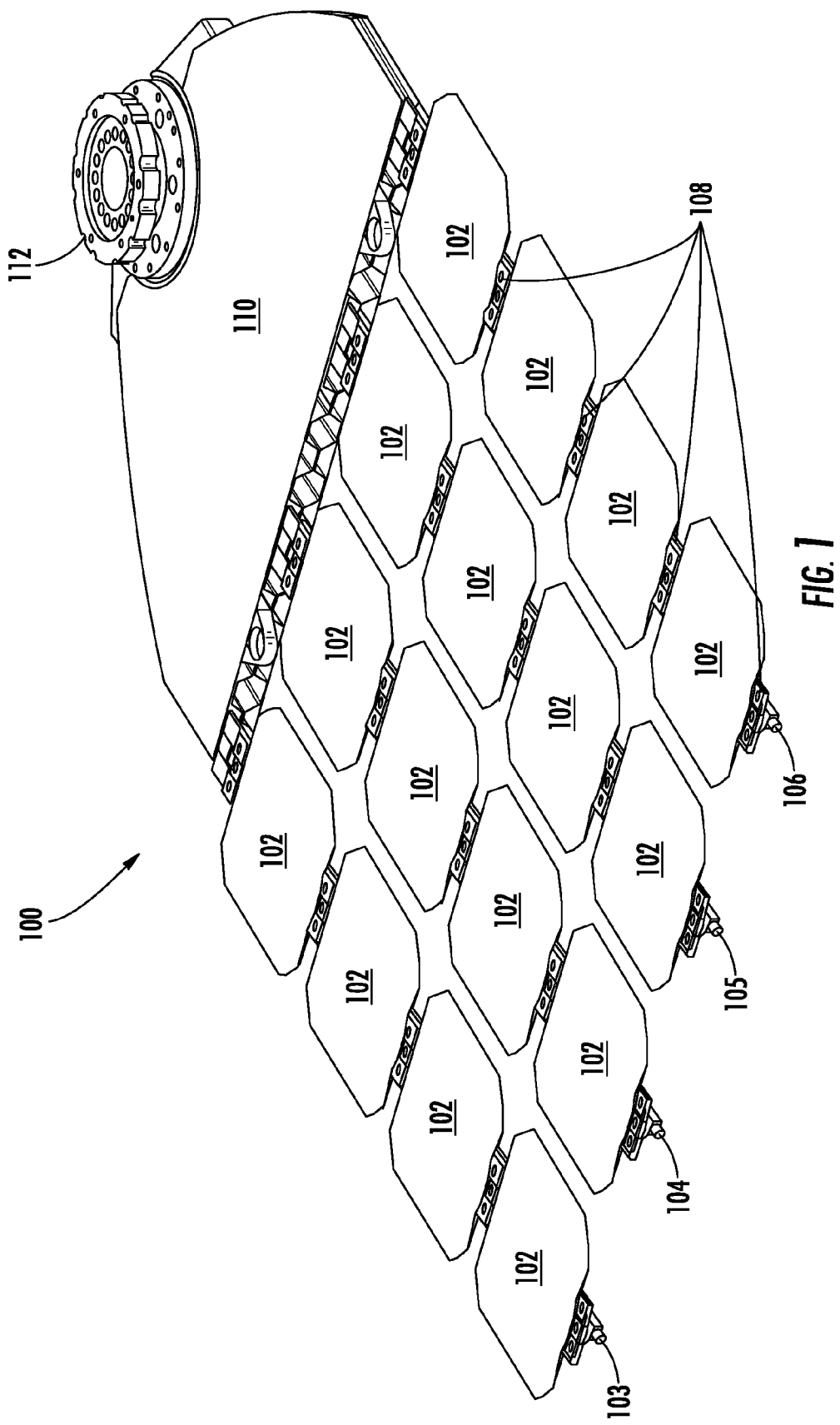
FIG. 1 is an isometric view illustrating an exemplary embodiment of an end effector in accordance with the present disclosure holding a plurality of substrates.

FIG. 1 is a top perspective view of an exemplary end effector in accordance with an embodiment of the present disclosure. In the illustrated embodiment, the end effector 100 is configured to hold a 4×4 array of 156 millimeter (mm) substrates 102, though other arrangements, sizes, or substrate types are possible. These substrates 102 may be supported on fingers 103-106 (best shown in FIG. 2) of the end effector 100 between opposing pairs of pads 108 (described in greater detail below) that may be disposed on the fingers 103-106 at spaced intervals. The fingers 103-106 may be coupled at one end to a base 110. The illustrated embodiment includes five pads 108 on each of the fingers 103-106, though the number of pads 108 may be varied based on the number of wafers that each of the fingers 103-106 is configured to support. The base 110 may include a wrist 112 which may be configured to provide an interface with a robot in a wafer handling system.

Figure 2:
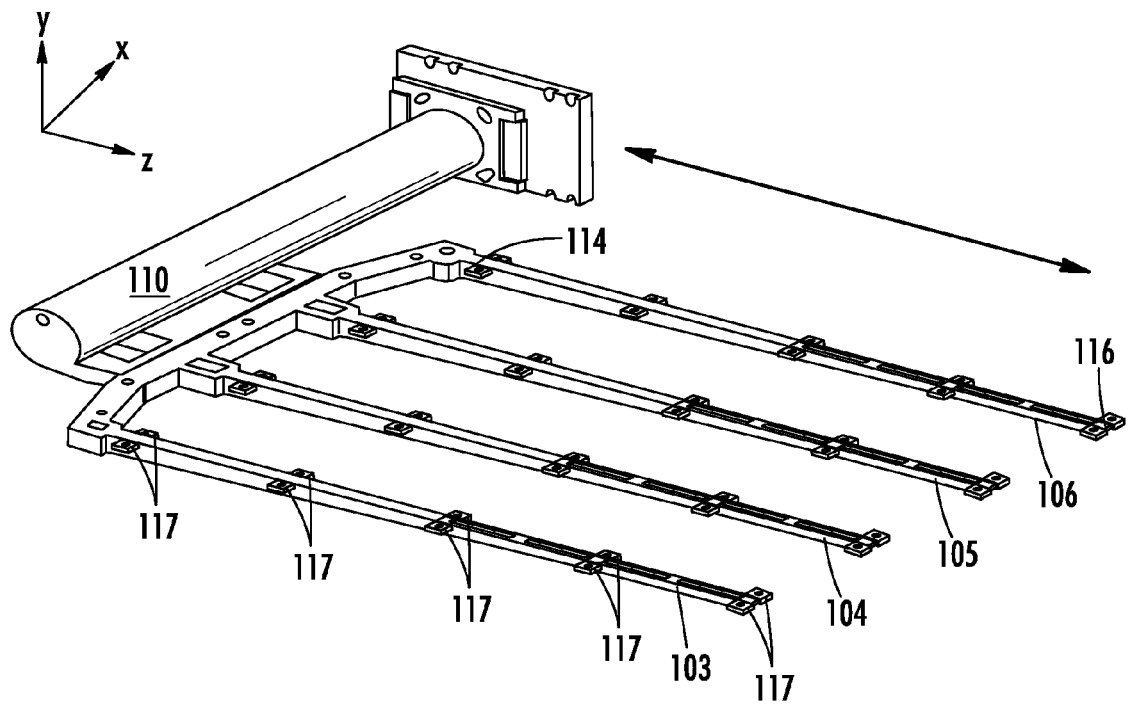
FIG. 2 is an isometric view illustrating of the end effector of FIG. 1 with the substrates and end effector pads removed.
Figure 4A:
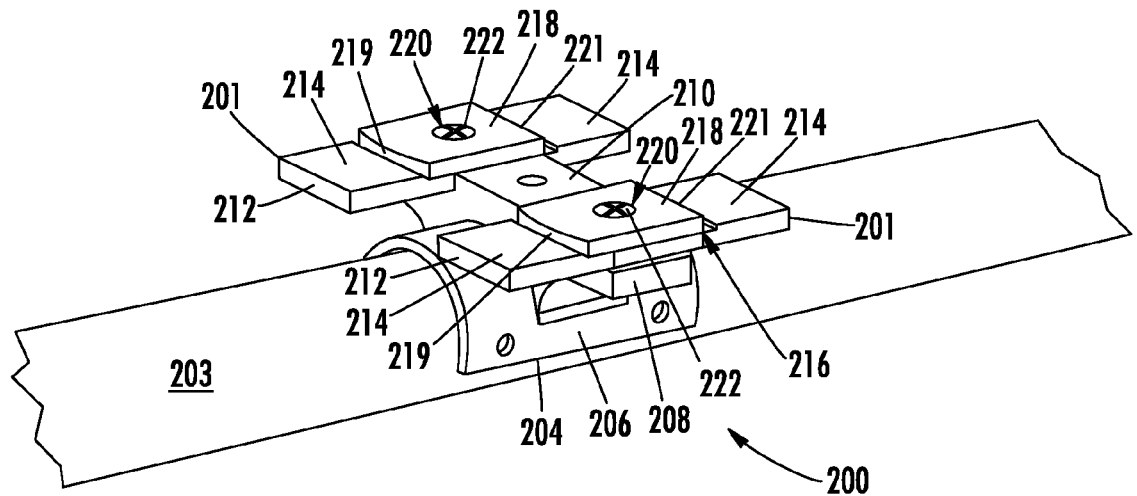
FIGS. 4A and 4B are isometric views illustrating an embodiment of end effector pad assembly in accordance with the present disclosure.
Figure 4B:
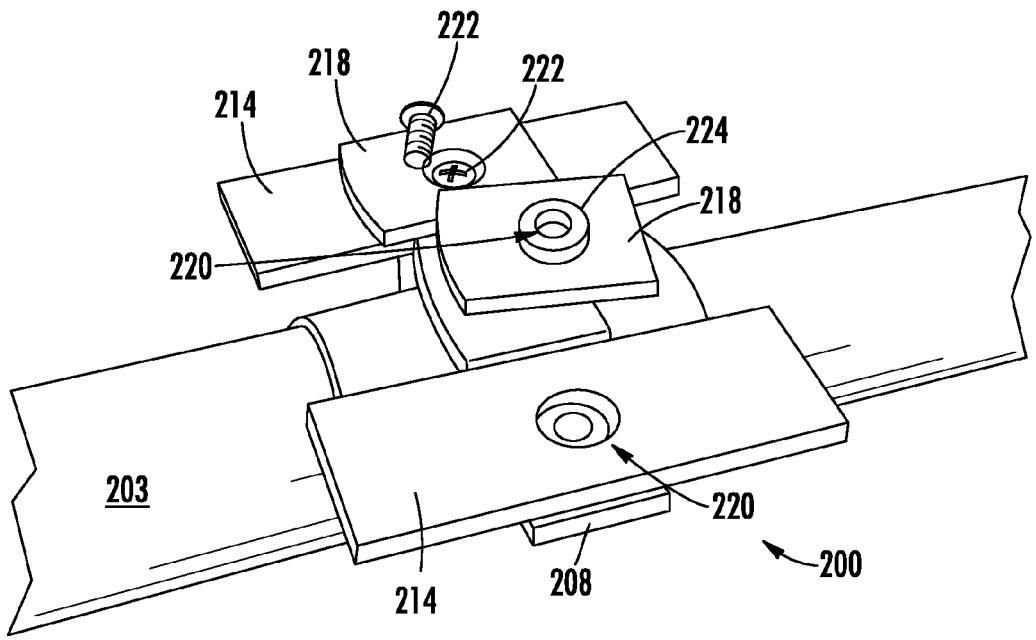

Referring to FIG. 2, the end effector 100 is shown with the pads 108 removed for clarity. The end effector 100 is shown as having four fingers 103-106, though it is contemplated that the end effector 100 may be provided with more or fewer fingers without departing from the present disclosure. The fingers 103-106 may be formed of any suitably rigid, lightweight material, including, but not limited to, aluminum and carbon fiber composite. The fingers 103-106 may be hollow or solid and may have any of a variety cross-sectional shapes, such as rectangular (as shown in FIG. 2) or round (as shown in FIGS. 4a and 4b). The fingers 103-106 may taper in both height (y-axis) and width (x-axis) from a proximal end 114 adjacent the base 110 to a distal end 116 located farther away from the base 110 (i.e., as measured along the z-axis). The stiffness of the fingers 103-106 may be maximized along the z-axis because the fingers 103-106, when in use, are subject to a load (i.e., the carried substrates) acting along the y-axis and thus are subject to bending forces applied along the y-axis.

Each of the fingers 103-106 may be provided with pairs of longitudinally-spaced mounting tabs 117 extending laterally therefrom. The mounting tabs 117 may be provided for facilitating affixation of the pads 108 (shown in FIG. 1) to the fingers 103-106 as further described below.

Figure 3:
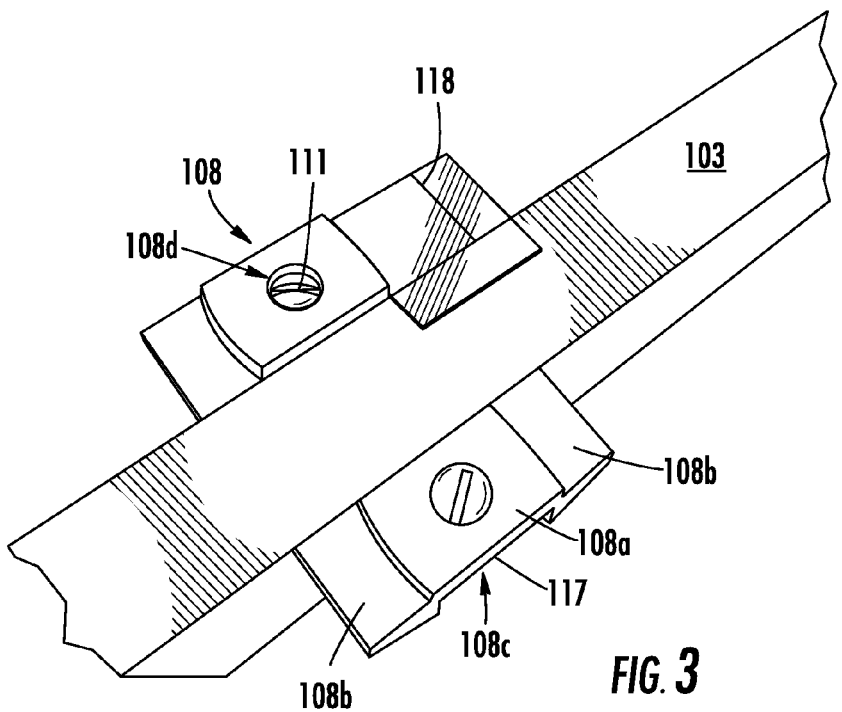
FIG. 3 is a detail view illustrating the end effector pads of the end effector of FIG. 1.

Referring to FIG. 3, a perspective view of one of the fingers 103 and a pair of pads 108 mounted thereto is shown. The finger 103 and pads 108 are substantially identical to each of the other fingers 104-106 and pads 108 shown in FIG. 1. It will therefore be understood that the following description of the finger 103 and pads 108 shall also apply to each of the other fingers 104-106 and pads 108 shown in FIG. 1.

As shown in FIG. 3, each of the pads 108 may have a fence member 108a and a pair of recessed support members 108b that extend from opposite longitudinal sides of the fence member 108a. Each pad 108 may further have a recess 108c formed in an underside thereof for receiving a respective mounting tab 117 of the finger 103 therein, thus locating and/or orienting the pads 108 in a desired manner relative to the finger 103. Each pad 108 may further be provided with a fastener hole 108d formed through the fence member 108a thereof for receiving a mechanical fastener such as a screw 111 for fastening the pads 108 to the mounting tabs 117. Alternatively, the pads 108 may be attached to the fingers 103-106 using an adhesive such as epoxy. As can be seen, the longitudinal edges of the fence members 108a may have a convex curvature so that each fence member 108a engages an edge of an associated substrate along a tangent of the convex curvature, thus aiding in consistent and accurate alignment of substrates. Alternatively, one or both sides of the fence members 108a may be flat.

A glass plate 118 may be bonded, adhered, or otherwise fastened to a top surface of each support member 108b of the pads 108 (only one glass plate 118 is shown in FIG. 3, but it will be understood that similar glass plates may be disposed atop each of the support members 108b). While the glass plate 118 is shown as being larger than the upper surface of the support member 108b, it is contemplated that the glass plate 108 may be the same size as, or may be smaller than, the upper surface of the support member 108b. The top surface of the glass plate 118 may extend above the top surface of the finger 103 to engage a substrate seated thereon as further described below.

The glass plate 118 may be formed of borosilicate float glass, fused silica, or any other appropriate material, selected for its hardness, flatness, low cost, low contamination, and low/consistent coefficient of friction relative to polyether ether ketone (PEEK) and other materials from which pads of end effectors are traditionally formed. For example, the upper surface of the glass plate 118 may have a surface finish of less than 4 micro inch RMS, may be approximately 6 on the Moh's Hardness Scale, may be much harder and more wear resistant than PEEK, may be flat within 0.0005" per square inch, and may have a consistent coefficient of friction (~0.3) between it and a textured substrate supported thereon.

During use, the end effector 100 may pick up a 4×4 matrix of 16 substrates 102 for transport as shown in FIG. 1. The longitudinal space between each pair of pads 108 on each finger 103-106 may be greater than the lengths (along the z-axis) of the substrates. Thus, it is often the case that the substrates are not aligned properly on the end effector 100 when they are first picked up. In order to align the substrates 102 in a desired manner, the end effector 100 may be sharply accelerated or "jerked" in the direction of the z-axis, thus causing the substrates 102 to slide relative to the fingers 103-106 and to seat or slam against the curved, longitudinal edges of the fence members 108a of the respective pads 108. This process, which is sometimes referred to as "fanging," thus facilitates proper positioning/alignment of the substrates.

Previous end effector designs have employed pads with substrate support surfaces formed of PEEK or other materials having a relatively high coefficient of friction compared to the glass plates 118 of the present disclosure. In order to effectively fang substrates seated on such support surfaces, an end effector may be subjected to high acceleration forces in order to overcome frictional engagement between the support surfaces and the substrates to effectuate sliding therebetween. However, it has been observed that these high acceleration forces may cause the fingers of an end effector to become excited and to vibrate, causing substrates seated on the fingers to "walk" and move out of alignment. The end effector 100 of the present disclosure overcomes or mitigates this problem, because the glass plates 118 which support the substrates 102 have a relatively low coefficient of friction compared to PEEK and similar materials. The end effector 100 may therefore be accelerated with less force during fanging to effectuate sliding between the glass plates 118 and the substrates 102, resulting in little or no excitation and vibration of the fingers 103-106. The alignment of the substrates 102 may thus be maintained.

Referring to FIGS. 4a and 4b, an end effector pad assembly 200 is shown having pads 201 coupled to the finger 203 of an end effector using a pad base 204. The pad base 204 may have a saddle member 206, one or more oppositely disposed pad engaging members 208, and a central alignment member 210 disposed above the saddle member 206. The saddle member 206 may be curved to encompass, conform, cover, or connect to at least a portion of the outer surface of the associated finger 203. The pads 201 can be removably fastened to the respective pad engaging members 208 of the pad base 204.

Each of the pads 201 may have a longitudinally-elongated support member 212 having a pair of upper support surfaces 214 separated by a recess or cut-out 216. Each pad 201 may further have a fence member 218 that is seated within the recess 216 in the support member 212. The longitudinal edges 219 of the fence members 218 that engage a substrate may have a convex curvature so that each fence member 218 engages an edge of an associated substrate along a tangent of the convex curvature, thus aiding in consistent and accurate alignment of substrates. The opposing longitudinal edges 221 of the fence members 218 may be flat. Since the lower edges of the fence members 218 are seated within the recesses 216, below the upper support surfaces 214, substrates that are seated on the upper support surfaces 214 are prevented from becoming wedged or trapped between the upper support surfaces 214 and the fence members 218.

In the illustrated embodiment, the pad engaging members 208, the support members 212, and the fence members 218 may have correspondingly aligned fastener holes 220 formed therein so that fasteners such as screws 222 can be used to fix them together. The fastener holes 220 in the support members 212 may be relatively larger for receiving respective nipples 224 formed on the bottoms of the fence members 218. The engagement between the nipples 224 and the fastener holes 220 may aid in the positioning and alignment of the fence members 218 relative to the support members 212. The height of the nipples 224 may be less than the height of the recesses 216 through which they extend so that the lower termini of the nipples 224 do not bottom out on the upper surfaces of the pad engaging members 208. Additionally, the fastener holes 220 in the fence members 218 may have diameters that are slightly larger than the diameters of the screws 222 and/or the fastener holes 220 in the support members 212 may have diameters that are slightly larger than the nipples 224 for allowing the fence members 218 to be slightly moved/aligned before tightening of the screws 220. When fully assembled, the support members 212 may be firmly clamped between the pad engaging members 208 and the fence members 218.

The support members 212 of the pads 201 may be formed of borosilicate float glass, fused silica, or any other appropriate material having a similar coefficient of friction for providing the above described advantages during fanging relative to the higher friction support surfaces of previous end effector pads. The fence members 218 may be formed or PEEK or any other suitable material.

Figure 5A:
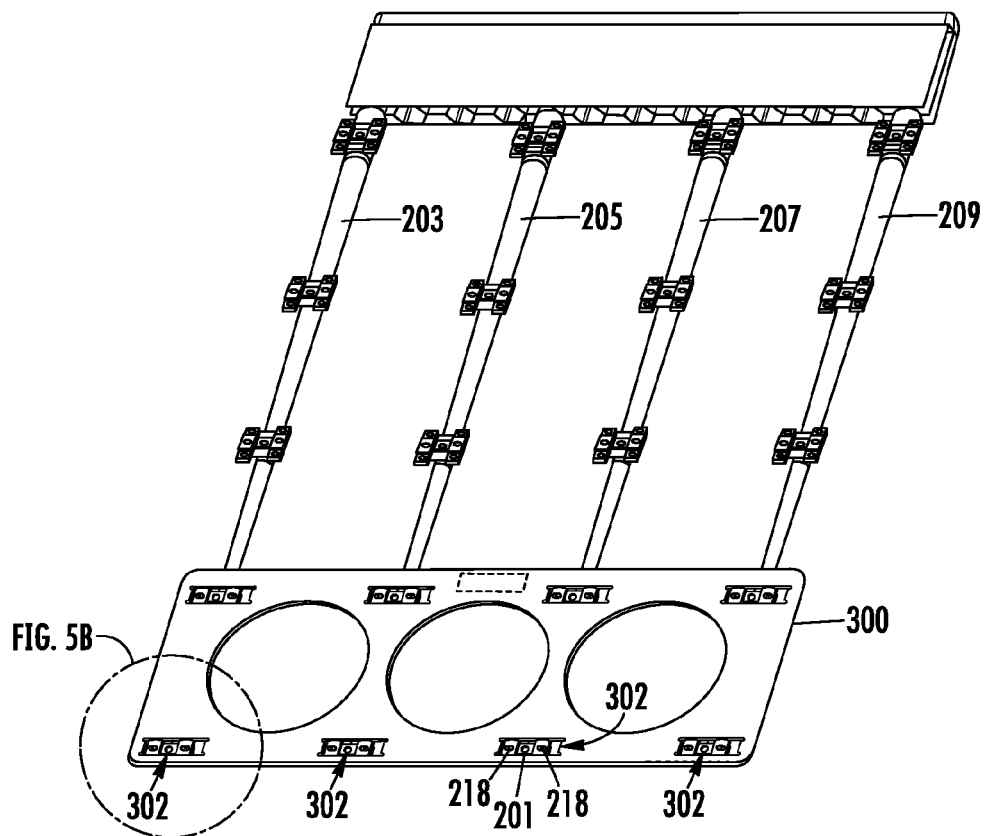
FIGS. 5A and 5B are isometric and detail views, respectively, of an exemplary jig for aligning the end effector pads of FIGS. 4A and 4B.
Figure 5B:
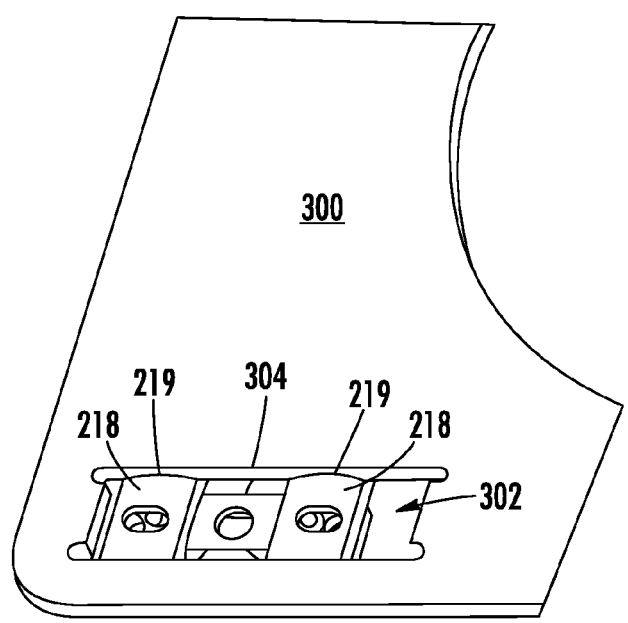

Shown in FIGS. 5A and 5B is an exemplary alignment jig 300 for use in aligning the fence members 218 of the pads 201 described above. The jig 300 includes a plurality of openings 302 that correspond to the position of the support members 212 (not within view) and fence members 218 relative to the fingers 203, 205, 207, and 209. A first edge 304 bounding each opening 302 may be oriented perpendicular to the axes of the fingers 203-209, and may be aligned with respective edges 219 of the fence members 218 associated with a particular pad 201. As described above, the edges 219 of the fence members 218 can have a convex curvature so that each fence member 218 engages an associated substrate along a tangent of the convex curvature. Aligning the edges 219 of the fence members 218 with the first edge 304 of the jig 300 ensures the fence members 218 are parallel, thus ensuring that a desired contact and alignment with an associated substrate will occur. The disclosed jig 300 may be used to align multiple sets of fence members 218 at once. The jig 300 may also be used to align multiple rows of pads 201 with respect to each other to achieve a proper pitch (i.e., spacing) between rows of substrates. The edges of the openings 302 that are perpendicular to the edges 304 may be used to ensure that sides of the pads 201 are parallel to the axes of the finger 203-209. This ensures properly-sized pockets between the pads 201 for receiving the substrates.

Figure 6:
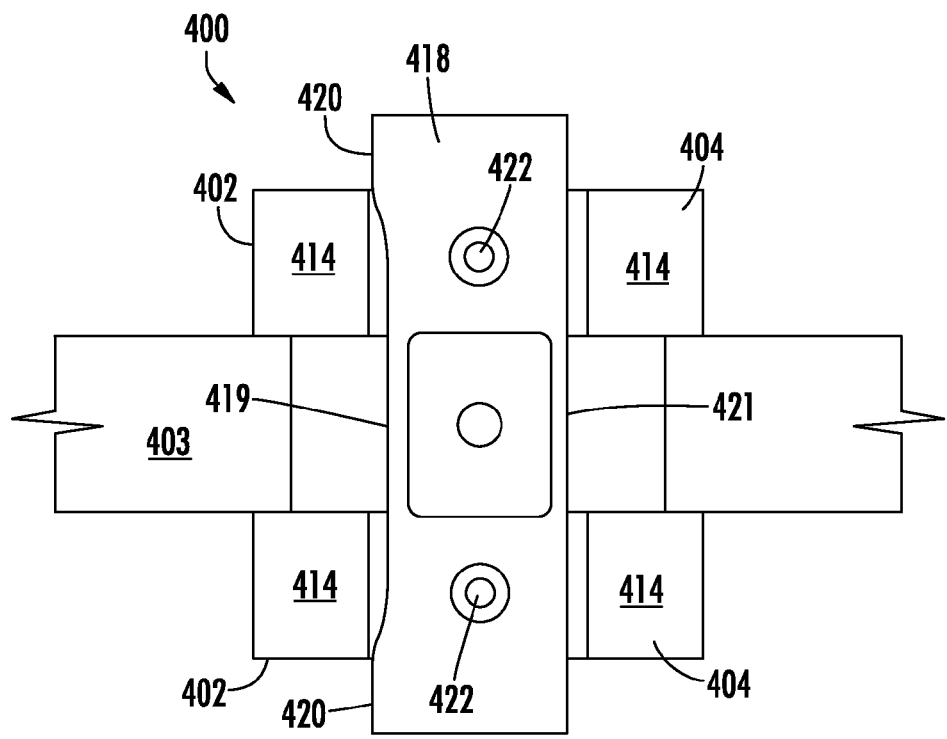
FIG. 6 is top view illustrating another embodiment of an end effector pad assembly in accordance with the present disclosure.

Referring to FIG. 6, another end effector pad assembly 400 is shown. The assembly 400 may include pads 402 having longitudinally-elongated support members 404 that are similar to the support members 212 described above, each pad 402 having a pair of upper support surfaces 414 separated by a recess or cut-out (not within view). However, the support members 404 may share a single, one-piece fence member 418 that extends laterally across the finger 403 and seats within the recesses of the support members 404. The longitudinal edge 419 of the fence member 418 that engages a substrate may have convex features 420 formed at the lateral ends thereof for engaging an associated substrate along a tangent of each convex feature 420, thus aiding in consistent and accurate alignment of substrates. The opposing longitudinal edge 421 of the fence member 418 may be flat.

The fence member 418 and support members 404 may be attached to the finger 403 by fasteners, such as screws 422, that engage mounting tabs (not within view, but similar to the mounting tabs 117 shown in FIG. 2) that extend from the finger 403. Alternatively, the fence member 418 and support members 404 may be attached to the finger 403 using a pad base similar to the pad base 204 shown in FIG. 4.

The one-piece fence member 418 of the pad assembly 400 provides improved fault tolerance relative to two-piece designs. Particularly, if one of the screws 422 becomes loose, the fence member 418 will still remain in place and will provide proper alignment of a substrate during fanging. The one-piece fence member 418 also provides wider spacing between the convex features 420 as compared to the convex features of two-piece fence member designs (e.g., about 1.99" in the one-piece design vs. about 1.16" in two-piece designs). The greater distance between the convex features 420 has been found to reduce allowable angular error by about 70%. The one-piece fence member 418 also simplifies the alignment of the fence member 420, since the fence member 420 has fewer degrees of freedom relative to two-piece designs.

As in the pad assembly 200 described above, the support members 404 of the pads 402 may be formed of borosilicate float glass, fused silica, or any other appropriate material having a similar coefficient of friction for providing the above described advantages during fanging relative to the higher friction support surfaces of previous end effector pads. The fence member 418 may be formed or PEEK or any other suitable material.

Figure 7:
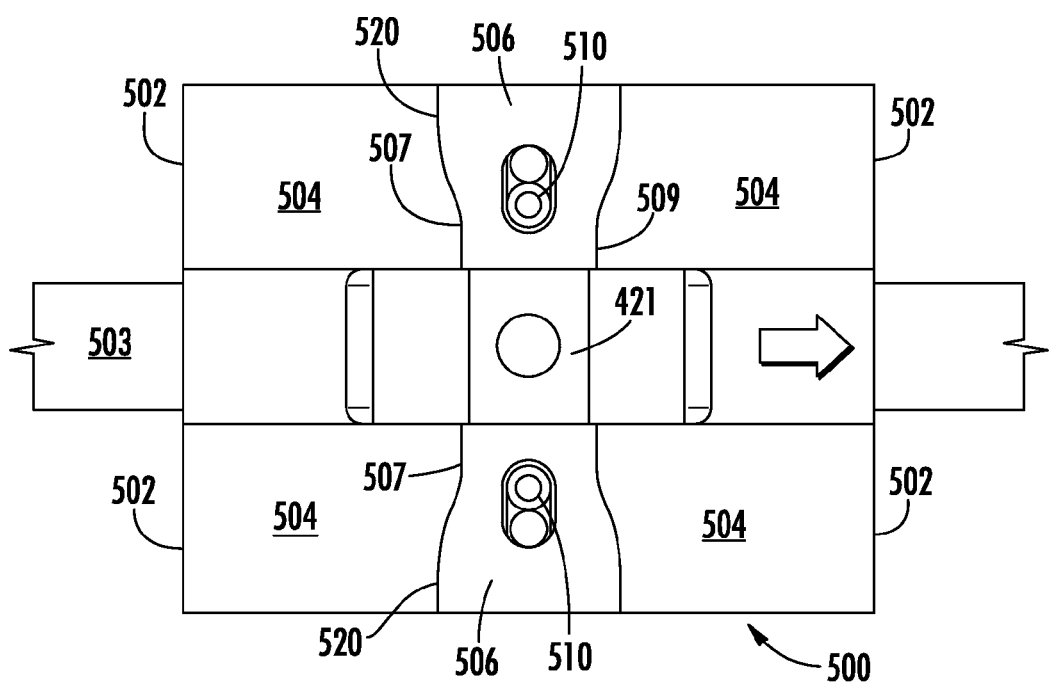
FIG. 7 is top view illustrating another embodiment of an end effector pad assembly in accordance with the present disclosure.

Referring to FIG. 7, another end effector pad assembly 500 is shown. The pad assembly 500 may be an entirely one-piece, unitary structure that may be molded from PEEK, borosilicate glass, fused silica, or any other suitable material. The one-piece pad assembly 500 may include pads 502 having integrated upper support surfaces 504 and fence members 506. The longitudinal edges 507 of the fence members 506 that engage a substrate may be provided with convex portions 520 formed at the lateral ends thereof for engaging an associated substrate along a tangent of each convex portion 520, thus aiding in consistent and accurate alignment of substrates. The convex portions 520 of the fence members 506 may be separated by a distance in a range of 1.5" to 2", for example. The opposing longitudinal edges 509 of the fence members 506 may also be provided with convex portions (for symmetry during manufacturing) or may be flat.

The pad assembly 500 may be attached to the finger 503 by fasteners, such as screws 510, that engage mounting tabs (not within view, but similar to the mounting tabs 117 shown in FIG. 2) that extend from the finger 503. Alternatively, the pad assembly 500 may be attached to the finger 503 using a pad base similar to the pad base 204 shown in FIG. 4.

As with the one-piece fence member 418 of the pad assembly 400 described above, the one-piece pad assembly 500 provides improved fault tolerance, increased spacing of convex features and resulting reduced angular error, and simplified alignment relative to traditional end effector designs. Moreover, the one-piece design of the pad assembly 500 facilitates fast and easy removal and replacement thereof, which may reduce the downtime of an end effector during maintenance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein. As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The invention claimed is:

1. An end effector pad comprising:
    a fence member;
    a recessed support member extending from a first convex, longitudinal edge of the fence member; and
    a plate disposed on top of the recessed support member for supporting a substrate thereon.

2. The end effector pad of claim 1, further comprising:
    a second recessed support member extending from a second longitudinal edge of the fence member opposite the first longitudinal edge; and
    a second plate disposed on top of the second recessed support member for supporting a substrate thereon.

3. The end effector pad of claim 1, wherein the plate is formed of glass.

4. The end effector pad of claim 1, wherein the plate is formed of fused silica.

5. The end effector pad of claim 1, further comprising a recess formed in an underside thereof for receiving a portion of an end effector.

\* \* \* \* \*